(12) United States Patent
Shan et al.

(10) Patent No.: US 10,665,725 B2
(45) Date of Patent: May 26, 2020

(54) THIN FILM TRANSISTOR

(71) Applicants: Kunshan New Flat Panel Display Technology Center Co., Ltd., Kunshan (CN); Kunshan Go-Visionox Opto-Electronics Co., Ltd., Kunshan (CN)

(72) Inventors: Qi Shan, Kunshan (CN); Xiuqi Huang, Kunshan (CN); Shixing Cai, Kunshan (CN); Xiaobao Zhang, Kunshan (CN); Rui Guo, Kunshan (CN); Li Lin, Kunshan (CN); Xiaoyu Gao, Kunshan (CN)

(73) Assignees: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 15/830,423

(22) Filed: Dec. 4, 2017

(65) Prior Publication Data

US 2018/0097119 A1    Apr. 5, 2018

Related U.S. Application Data (63) Continuation of application No. PCT/CN2016/084245, filed on Jun. 1, 2016.

(30) Foreign Application Priority Data

Jun. 4, 2015    (CN) .......................... 2015 1 0305703

(51) Int. Cl.
*H01L 29/786* (2006.01)
*H01L 29/66* (2006.01)

(52) U.S. Cl.
CPC .... *H01L 29/78648* (2013.01); *H01L 29/6675* (2013.01); *H01L 29/66484* (2013.01); *H01L 29/78621* (2013.01)

(58) Field of Classification Search
CPC ......... H01L 29/66484; H01L 29/78621; H01L 29/78648; H01L 29/6675; H01L 29/66;
(Continued)

(56) References Cited

U.S. PATENT DOCUMENTS

2010/0102313 A1    4/2010 Miyairi et al.
2010/0117079 A1    5/2010 Miyairi et al.
(Continued)

FOREIGN PATENT DOCUMENTS

CN    101071845 A    11/2007
CN    101527400 A    9/2009
(Continued)

OTHER PUBLICATIONS

Korean Office Action for KR Application No. 10-2017-7036339 dated Jan. 31, 2019.
(Continued)

*Primary Examiner* — Thanh T Nguyen
(74) *Attorney, Agent, or Firm* — Flener IP & Business Law; Zareefa B. Flener (57) ABSTRACT

A thin film transistor and a preparation method thereof are provided. The thin film transistor includes an upper gate electrode, a lower gate electrode, an upper insulating layer, a lower insulating layer, a semiconductor layer, a source electrode and a drain electrode. The lower insulating layer is arranged on the lower gate electrode, the semiconductor layer is arranged on the lower insulating layer, the semiconductor layer is respectively lapped with the source electrode and the drain electrode, the upper insulating layer covers the semiconductor layer, and the upper gate electrode is
(Continued)

arranged on the upper insulating layer. In a plane parallel to a conducting channel, there is a first gap between an orthographic projection of the upper gate electrode and an orthographic projection of the source electrode, and there is a second gap between the orthographic projection of the upper gate electrode and an orthographic projection of the drain electrode.

7 Claims, 4 Drawing Sheets

(58) Field of Classification Search
CPC ....... H01L 29/786; H01L 21/28; H01L 29/41; H01L 29/41733; H01L 29/42384; H01L 29/78606; H01L 29/78618
See application file for complete search history.

(56) References Cited

U.S. PATENT DOCUMENTS

| | | | |
|---|---|---|---|
| 2011/0079784 A1 | 4/2011 | Im | |
| 2011/0273419 A1* | 11/2011 | Park | G09G 3/30 345/211 |
| 2015/0144952 A1 | 5/2015 | Kim et al. | |

FOREIGN PATENT DOCUMENTS

| | | |
|---|---|---|
| CN | 102197490 A | 9/2011 |
| CN | 104409512 A | 3/2015 |
| EP | 3306669 A1 | 4/2018 |
| JP | 2006237624 A | 9/2006 |
| JP | 2010141308 A | 6/2010 |
| JP | 2011082487 A | 4/2011 |
| JP | 2012033835 A | 2/2012 |
| KR | 20000047907 A | 7/2000 |
| KR | 20010032543 A | 4/2001 |
| KR | 1020080103736 A | 11/2008 |
| KR | 20110037220 A | 4/2011 |
| KR | 20110111542 A | 10/2011 |
| KR | 20140144566 A | 12/2014 |
| TW | 200735366 A | 9/2007 |
| TW | 201501317 A | 1/2015 |
| WO | 2014200190 A1 | 12/2014 |
| WO | WO2014200190 A1 | 12/2014 |

OTHER PUBLICATIONS

Japanese Office Action for JP Application No. 2017-563061 dated Nov. 21, 2018.
Chinese Office Action for CN Application No. 201510305703.X dated Oct. 31, 2018.
Notice of Authorization from KIPO dated Aug. 21, 2019.

* cited by examiner

THIN FILM TRANSISTOR

CROSS-REFERENCE TO RELATED APPLICATIONS

This application is a continuation of International Application No. PCT/CN2016/084245, filed on Jun. 1, 2016, which claims priority to Chinese Patent Application No. 201510305703.X, filed on Jun. 4, 2015. The disclosures of the aforementioned applications are hereby incorporated by reference in their entireties.

TECHNICAL FIELD

The present invention relates to the technical field of optoelectronic display, and in particular to a thin film transistor and a preparation method thereof.

BACKGROUND

In the prior art, in order to improve the mobility of thin film transistors, a double-gate structure, i.e., a structure with an upper gate electrode and a lower gate electrode, can be used to induce double channels at a semiconductor layer to enlarge a conducting pathway.

Figure 1:
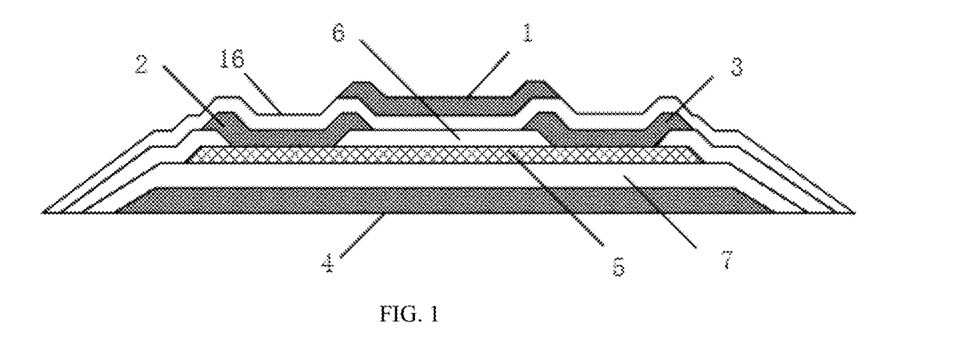
FIG. 1 is a schematic structure diagram of a thin film transistor having a double-gate structure according to the prior art.

FIG. 1 is a schematic structure diagram of a thin film transistor having a double-gate structure in the prior art As shown in FIG. 1, an upper gate electrode 1 of the thin film transistor is overlapped on a source electrode 2 and a drain electrode 3. When the voltages of the upper gate electrode 1 and the lower gate electrode 4 both reach a turn-on voltage (the turn-on voltage is a threshold voltage, and when a voltage of a gate electrode is greater than the turn-on voltage, a conducting channel can be formed in the semiconductor layer by induction), an upper conducting channel and a lower conducting channel which are parallel to each other can be formed in the semiconductor layer 5 by induction. Since the upper gate electrode 1 is overlapped on the source electrode 2 and the drain electrode 3, that is, in a plane parallel with the conducting channel in the semiconductor layer 5, an orthographic projection of the upper gate electrode 1 is partially overlapped with an orthographic projection of the source electrode 2 and an orthographic projection of the drain electrode 3 respectively, the drain electrode 3 can be conducted with the source electrode 2 separately by the upper conducting channel. In addition, the drain electrode 3 can also be conducted with the source electrode 2 separately by the lower conducting channel. However, for thin film transistors with such a double-gate structure, it is difficult to ensure the improvement of mobility by simultaneous conduction of the upper conducting channel and the lower conducting channel.

Because of process technologies, it is difficult to match parameters such as capacitance of an upper insulating layer 6 below the upper gate electrode 1 and a lower insulating layer 7 above the lower gate electrode. This will result in different turn-on voltages of the upper conducting channel and the lower conducting channel respectively formed in the upper gate electrode 1 and the lower gate electrode 4. Thus, it is difficult to achieve simultaneous conduction of the upper conducting channel and the lower conducting channel in the thin film transistor structure in the prior art.

SUMMARY

Accordingly, embodiments of the present invention provide a thin film transistor and a preparation method thereof, to solve the problem that it is difficult to achieve simultaneous conduction of an upper conducting channel and a lower conducting channel for an upper gate electrode and a lower gate electrode of the thin film transistors in the prior art.

Embodiments of the present invention provide a thin film transistor, the thin film transistor comprises an upper gate electrode, a lower gate electrode, an upper insulating layer, a lower insulating layer, a semiconductor layer, a source electrode and a drain electrode. The lower insulating layer is arranged on the lower gate electrode; the semiconductor layer is arranged on the lower insulating layer, the semiconductor layer is respectively lapped with the source electrode and the drain electrode, the upper insulating layer is covered on the semiconductor layer, and the upper gate electrode is arranged on the upper insulating layer. In a plane parallel with a conducting channel in the semiconductor layer, there is a first gap between an orthographic projection of the upper gate electrode and an orthographic projection of the source electrode, and there is a second gap between the orthographic projection of the upper gate electrode and an orthographic projection of the drain electrode.

Embodiments of the present invention further provide a method for preparing a thin film transistor, comprising the steps of:

depositing a metal layer on a substrate, and patterning the metal layer to form a lower gate electrode;

depositing a lower insulating layer on a surface of the lower gate electrode, depositing a semiconductor layer on a surface of the lower insulating layer, and then depositing an upper insulating layer on a surface of the semiconductor layer;

forming, by respectively etching, a source electrode hole and a drain electrode hole on a surface of the upper insulating layer at positions corresponding to a source electrode and a drain electrode, and bottoms of the source electrode hole and the drain electrode hole being communicated with the semiconductor layer; and depositing a metal layer on the surface of the upper insulating layer and in the source electrode hole and the drain electrode hole, and patterning the metal layer to form the source electrode, the drain electrode and an upper gate electrode, wherein in a plane parallel with a conducting channel in the semiconductor layer, there is a first gap between an orthographic projection of the upper gate electrode and an orthographic projection of the source electrode, and there is a second gap between the orthographic projection of the upper gate electrode and an orthographic projection of the drain electrode.

For a thin film transistor according to the embodiments of the present invention, in a plane parallel with a conducting channel in the semiconductor layer, there is a first gap between an orthographic projection of the upper gate electrode and an orthographic projection of the source electrode, and there is a second gap between the orthographic projection of the upper gate electrode and an orthographic projection of the drain electrode. Thus, the conduction of the upper conducting channel cannot be independently realized by the upper gate electrode. Only when the voltage of the lower gate electrode reaches a turn-on voltage, the conduction of the upper conducting channel can be indirectly achieved by the lower conducting channel formed by the induction of the lower gate electrode, thereby achieving simultaneous conduction of the upper conducting channel and the lower conducting channel.

REFERENCE NUMERALS 1 upper gate electrode
4 lower gate electrode
6 upper insulating layer
7 lower insulating layer
5 semiconductor layer
2 source electrode
3 drain electrode
8 first gap
9 second gap
10 upper conducting channel
11 lower conducting channel
12 first semiconductor material high-resistance region
13 second semiconductor material high-resistance region
14 source electrode hole
15 drain electrode hole
16 passivation layer.

DETAILED DESCRIPTION

In order to make purposes, technical solutions and advantages of the present invention clearer, the present invention will be further described in detail with reference to the accompanying drawings.

Figure 2:
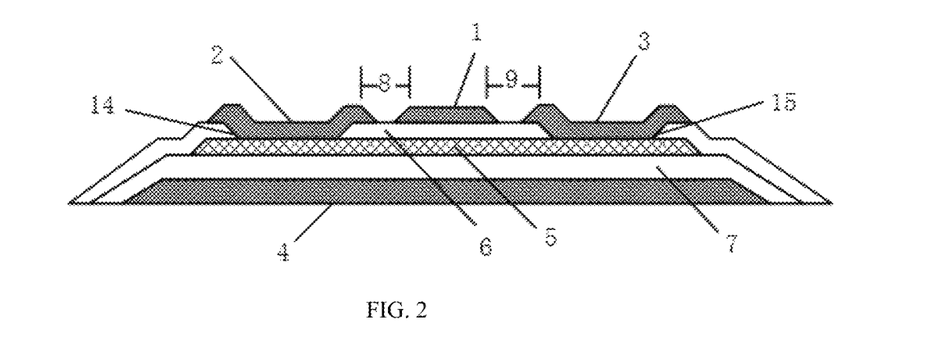
FIG. 2 is a schematic structure diagram of a thin film transistor according to an embodiment of the present invention.

FIG. 2 is a schematic structure diagram of a thin film transistor according to an embodiment of the present invention. As shown in FIG. 2, the thin film transistor comprises an upper gate electrode 1, a lower gate electrode 4, an upper insulating layer 6, a lower insulating layer 7, a semiconductor layer 5, a source electrode 2 and a drain electrode 3. The lower insulating layer 7 is arranged on the lower gate electrode 4, the semiconductor layer 5 is arranged on the lower insulating layer 7, the semiconductor layer 5 is lapped with the source electrode 2 and the drain electrode 3, the upper insulating layer 6 covers the semiconductor layer 5, and the upper gate electrode 1 is arranged on the upper insulating layer 6. In a plane parallel to a conducting channel in the semiconductor layer 5, there is a first gap 8 between an orthographic projection of the upper gate electrode 1 and an orthographic projection of the source electrode 2, and there is a second gap 9 between the orthographic projection of the upper gate electrode 1 and an orthographic projection of the drain electrode 3.

It can be understood by a person skilled in the art that the way that the semiconductor layer 5 is lapped with the source electrode 2 and the drain electrode 3 can be adjusted according to actual structure design requirements, as long as the conduction of the conducting channel in the semiconductor layer 5 with the source electrode 2 and the drain electrode 3 can be realized. The way that the semiconductor layer 5 is lapped with the source electrode 2 and the drain electrode 3 is not limited in the present invention.

In an embodiment of the present invention, as shown in FIG. 2, a surface of the upper insulating layer 6 comprises a source electrode hole 14 and a drain electrode hole 15. The way that the semiconductor layer 5 is lapped with the source electrode 2 and the drain electrode 3 is as follows: the source electrode 2 is lapped with a surface of the semiconductor layer 5 by the source electrode hole 14 on the surface of the upper insulating layer 6, and the drain electrode 3 is lapped with the surface of the semiconductor layer 5 by the drain electrode hole 15 on the surface of the upper insulating layer 6. It can be seen that, unlike the thin film transistor having a double-gate structure (i.e., a structure with an upper gate electrode and a lower gate electrode) in the prior art, when using the above lapping method, the upper gate electrode 1 is in a same layer as the source electrode 2 and the drain electrode 3, instead of being overlapped on the source electrode 2 and the drain electrode 3. Since in a plane parallel with the conducting channel in the semiconductor layer 5, there is the first gap 8 between the orthographic projection of the upper gate electrode 1 and the orthographic projection of the source electrode 2 and the second gap 9 between the orthographic projection of the upper gate electrode 1 and the orthographic projection of the drain electrode 3, regions in the semiconductor layer 5 corresponding to the first gap 8 and the second gap 9 are always in the high-resistance state. In this way, even the voltage of the upper gate electrode 1 reaches a turn-on voltage and an upper conducting channel in the low-resistance state is formed by induction of the semiconductor layer 5 corresponding to the upper gate electrode 1, it is unable to achieve the conduction between the upper conducting channel and the source electrode 2 and drain electrode 3. Only when the voltage of the lower gate electrode 4 reaches the turn-on voltage, the conduction of the upper conducting channel can be indirectly achieved by the lower conducting channel formed by induction of the lower gate electrode 4, thereby achieving simultaneous conduction of the upper conducting channel and the lower conducting channel.

In addition, as shown in FIG. 1, in the prior art, since the upper gate electrode 1 is overlapped on the source electrode 2 and the drain electrode 3, it is necessary to separately design a passivation layer 16 to perform mask etching for the preparation of the upper gate electrode 1, thereby increasing preparation costs. However, when a structure of the thin film transistor shown in FIG. 2 is used, the upper gate electrode 1 is in a same layer as the source electrode 2 and the drain electrode 3, and thus it is not necessary to separately design a single mask etching process for the preparation of the upper gate electrode 1. The upper gate electrode 1, the source electrode 2 and the drain electrode 3 can be synchronously formed by etching once, thereby saving the preparation costs.

Figure 3:
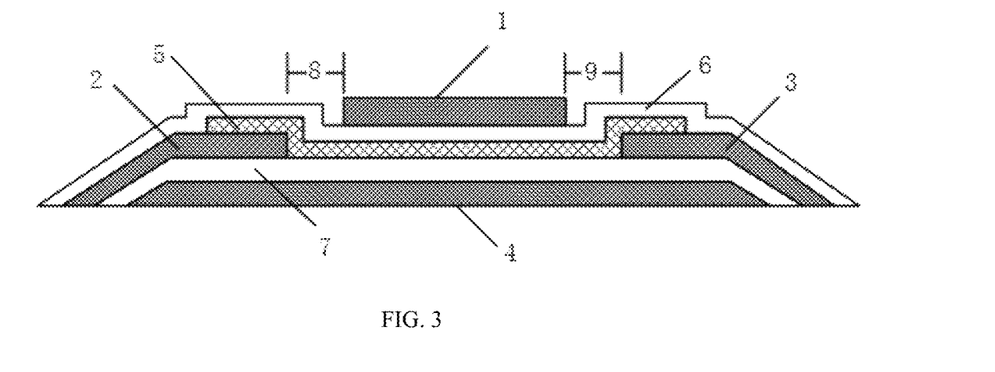
FIG. 3 is a schematic structure diagram of a thin film transistor according to another embodiment of the present invention.

FIG. 3 is a schematic structure diagram of a thin film transistor according to another embodiment of the present invention. Unlike the structure shown in FIG. 2, in the thin film transistor structure shown in FIG. 3, the semiconductor layer 5 is lapped with the source electrode 2 and the drain electrode 3 in another way in which the simultaneous conduction of the upper conducting channel and the lower conducting channel can also be achieved. Specifically, the source electrode 2 and the drain electrode 3 are arranged on the lower insulating layer 7, and the semiconductor layer 5 is lapped with the surface of the source electrode 2, the surface of the drain electrode 3 and the surface of the lower insulating layer 7. In this way, when the voltages of the upper gate electrode 1 and the lower gate electrode 4 both reach the turn-on voltage, an upper conducting channel and a lower conducting channel which are parallel to each other can be formed in the semiconductor layer 5 by induction, and the simultaneous conduction of the upper and lower conducting channels with the source electrode 2 and the drain electrode 3 can be achieved.

In an embodiment of the present invention, the semiconductor layer 5 is generally thin to prevent an excessive parasitic resistance when the current from the source electrode 2/the drain electrode 3 breaks down the semiconductor layer 5 and reaches the conducting channel. However, since the depth of the conducting channel is between 3 nm and 15 nm in the ON-state, the thickness of the semiconductor layer 5 can be set between 10 nm and 200 nm to ensure that the upper conducting channel and the lower conducting channel in the semiconductor layer 5 can be simultaneously conducted without influencing each other. In an embodiment, the thickness of the semiconductor layer 5 can be specifically set to be 30 nm. Such a thickness can ensure that sufficiently wide conducting channels are formed on the upper and lower surfaces on the semiconductor layer 5, and that parasitic resistance generated when the source electrode 2/the drain electrode 3 is lapped with the conducting channel can be decreased as much as possible.

As mentioned above, in a plane parallel with a conducting channel in the semiconductor layer 5, there is the first gap 8 between the orthographic projection of the upper gate electrode 1 and the orthographic projection of the source electrode 2, and there is the second gap 9 between the orthographic projection of the upper gate electrode 1 and the orthographic projection of the drain electrode 3. The width of the first gap 8 corresponds to a first semiconductor material high-resistance region, and the width of the second gap 9 corresponds to a second semiconductor material high-resistance region. To ensure that there is a semiconductor material high-resistance region between the upper conducting channel 10 and the source electrode 2 as well as the drain electrode 3, and that the volume of the thin film transistor is reduced as much as possible, the width of the first gap 8 and the width of the second gap 9 can be adjusted according to an intrinsic resistance of semiconductor material of the semiconductor layer 5 and a minimum leakage current that the semiconductor material can withstand. When the voltage of the lower gate electrode 4 has not reached the turn-on voltage while the voltage of the upper gate electrode has already reached the turn-on voltage, the leakage current flowing through the semiconductor layer 5 can be expressed by $I_{leak}=U_d/(2R*W/D)$, where $U_d$ is a drain voltage, R is an intrinsic resistance of the semiconductor layer 5, W is the width of the semiconductor layer 5, and Dum is the width of the first gap 8/the second gap 9.

In an embodiment of the present invention, when the intrinsic sheet resistance R of the semiconductor material (for example, metal oxides) selected for the semiconductor layer 5 can reach 1e+12Ω, the drain voltage $U_d$ is 10 V, the width W of the semiconductor layer 5 is 5 um, and the width D of the first gap 8/the second gap 9 is 1 um which is a process limit value for processing the first gap 8/the second gap 9 between the upper gate electrode 1 and the source electrode 2/the drain electrode 3, the leakage current $I_{leak}$ thus obtained is 0.5 pA, which can meet the requirements on OLED devices. Thus, the minimum width of the first gap 8/the second gap 9 between the upper gate electrode 1 and the source electrode 2/the drain electrode 3 can be 1 um. In an embodiment of the present invention, the width of the first gap 8 and the width of the second gap 9 can be specifically set to be 3 um, which can ensure that a lithography machine operates under stable process conditions and realizes a relatively high process precision, and that the leakage current of the upper gate electrode 1 can be controlled within a magnitude of 1 pA and also meet the requirements for OLED devices. The width of the first gap 8 and the width of the second gap 9 are not strictly limited in the present invention.

In an embodiment of the present invention, the semiconductor layer 5 can be made of semiconductor material such as metal oxides (for example, IGZO), or noncrystalline silicon, or polycrystalline silicon or microcrystalline silicon material. Material for preparing the semiconductor layer 5 is not limited in the present invention.

In an embodiment of the present invention, the upper gate electrode 1, the lower gate electrode 4, the source electrode 2 and the drain electrode 3 can be made of Mo metal material or other conducting material. The material for preparing the upper gate electrode 1, the lower gate electrode 4, the source electrode 2 and the drain electrode 3 is not limited in the present invention either.

Figure 4:
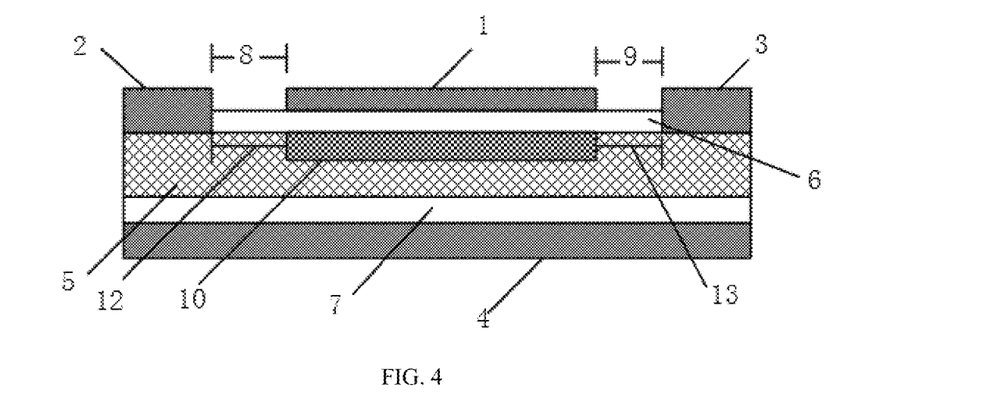
FIG. 4 is a schematic view illustrating the conducting principle of a thin film transistor according to an embodiment of the present invention.

FIG. 4 is a schematic view illustrating the conducting principle of a thin film transistor according to an embodiment of the present invention. As shown in FIG. 4, the semiconductor layer 5 is lapped with the source electrode 2 and the drain electrode 3 in the way shown in FIG. 2. Since the voltage of the lower gate electrode 4 has not yet reached the turn-on voltage of the lower gate electrode 4, the conduction of the lower conducting channel cannot be achieved in the semiconductor layer 5. Thus, even the voltage of the upper gate electrode 1 has reached the turn-on voltage of the upper gate electrode 1, since the upper gate electrode 1 is in a same layer as the source electrode 2 and the drain electrode 3 and overlapped with a part of the upper insulating layer 6 instead of being overlapped on the source electrode 2 and the drain electrode 3, and since there is the first gap 8 between the upper gate electrode 1 and the source electrode 2 and the second gap 9 between the upper gate electrode 1 and the drain electrode 3, only a relatively short upper conducting channel 10 corresponding to the upper gate electrode 1 can be formed in the semiconductor layer 5 by induction of the upper gate electrode 1. There is a semiconductor material high-resistance region 12 corresponding to the first gap 8 between this upper conducting channel 10 and the source electrode 2 and a semiconductor material high-resistance region 13 corresponding to the second gap 9 between this upper conducting channel 10 and the drain electrode 3. Thus, this upper conducting channel 10 cannot be conducted with the source electrode 2 and the drain electrode 3. It can be seen that, when the voltage of the lower gate electrode 4 does not reach the turn-on voltage of the lower gate electrode 4, the upper conducting channel 10 cannot be conducted with the source electrode 2 and the drain electrode 3 no matter whether the voltage of the upper gate electrode 1 reaches the turn-on voltage of the upper gate electrode 1 or not.

Figure 5:
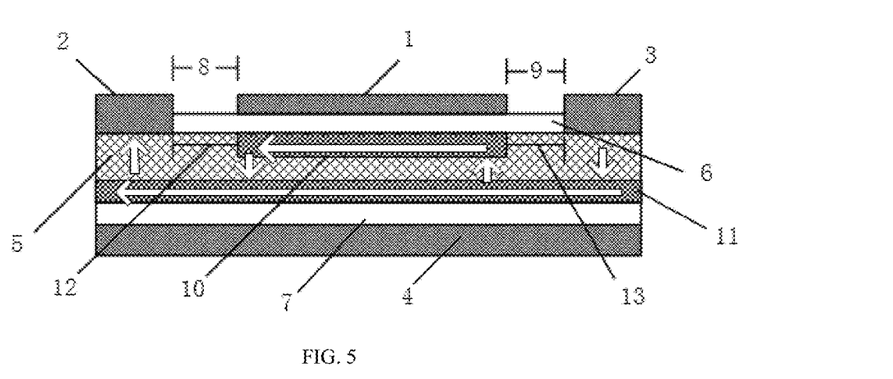
FIG. 5 is a schematic view illustrating the conducting principle of a thin film transistor according to an embodiment of the present invention.

FIG. 5 is a schematic view illustrating the conducting principle of a thin film transistor according to an embodiment of the present invention. As shown in FIG. 5, the semiconductor layer 5 is lapped with the source electrode 2 and the drain electrode 3 in the way shown in FIG. 2. The voltage of the lower gate electrode 4 has reached the turn-on voltage of the lower gate electrode 4, the flow direction of the current in the semiconductor layer 5 is shown by the arrow in the drawing. Specifically, since the voltage of the lower gate electrode 4 has reached the turn-on voltage of the lower gate electrode 4, the lower conducting channel 11 has been formed in the semiconductor layer 5. Due to the small thickness of the semiconductor layer 5, the current can break down the semiconductor layer 5 from the drain electrode 3 and reach the lower conducting channel 11, and can break down the semiconductor layer 5 again via the lower conducting channel 11 and flow towards the source electrode 2. At this point, when the voltage of the upper gate electrode 1 also reaches the turn-on voltage of the upper gate electrode 1, the current can break down the semiconductor layer 5 from the lower conducting channel 11 and reach the upper conducting channel 10, and can break down the semiconductor layer 5 again via the upper conducting channel 10 and finally flow towards the source electrode 2. Thus, simultaneous conduction of the upper conducting channel 10 and the lower conducting channel 11 is achieved, thereby improving the mobility.

It can be understood by a person skilled in the art that, in order to achieve simultaneous conduction of the upper conducting channel 10 and the lower conducting channel 11, an operator can set the circuit structures of the upper gate electrode 1 and the lower gate electrode 4 in various ways. For example, an operator can independently set the upper gate electrode 1 and the lower gate electrode 4 in the circuit structures without parallel arranging, so that the voltage of the upper gate electrode 1 is always higher than the turn-on voltage of the upper gate electrode 1. However, due to the first gap 8 and the second gap 9, the upper conducting channel 10 will not be conducted with the source electrode 2 and the drain electrode 3. Only when the voltage of the lower gate electrode 4 reaches the turn-on voltage of the lower gate electrode 4, the upper gate electrode 1 can be indirectly conducted with the upper conducting channel 10 by the lower conducting channel 11 formed by induction of the lower gate electrode 4. The method for arranging respective circuit structures of the upper gate electrode 1 and the lower gate electrode 4 is not limited in the present invention.

Figure 6:
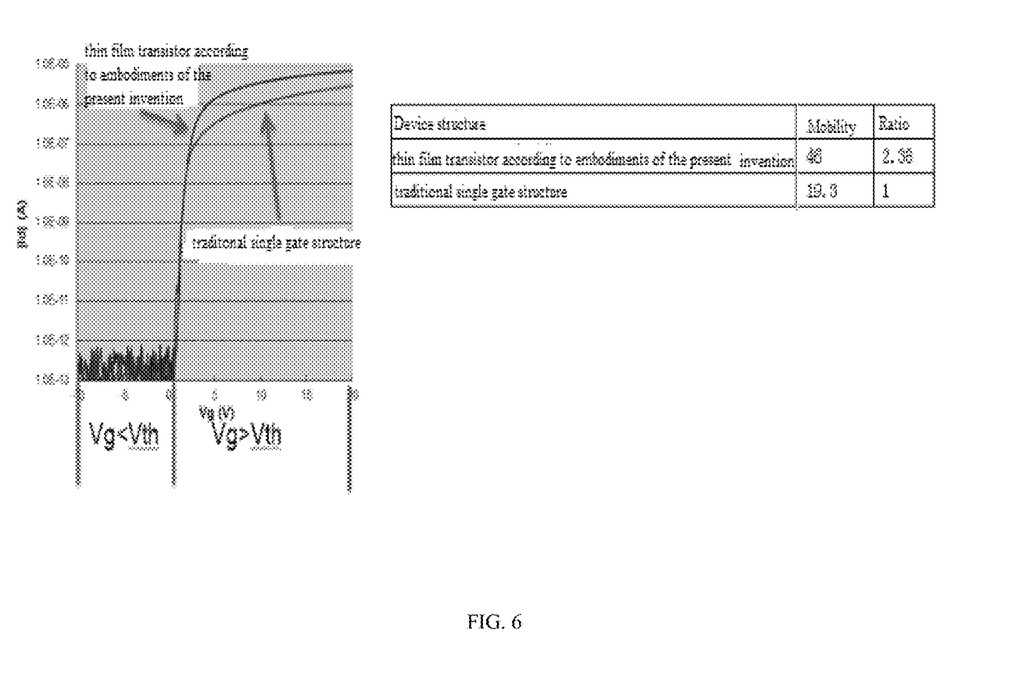
FIG. 6 is a view showing results of a conducting test of a thin film transistor according to an embodiment of the present invention.

FIG. 6 is a view showing results of a conducting test of a thin film transistor according to an embodiment of the present invention. As shown in FIG. 6, Vg represents a voltage of the lower gate electrode 4, Vth represents the turn-on voltage of the lower gate electrode 4, and |Id| represents the intensity of current conducted in the semiconductor layer 5. The ratio means a ratio of the mobility of the thin film transistor of the present invention to the mobility of a thin film transistor with a traditional single-gate structure. The test conditions are the drain voltage Vd=0.1 V and Vg=−10 ~ 20 V. It can be seen from FIG. 6 that the thin film transistor structure according to the embodiments of the present invention can obtain a mobility of more than twice of that of the traditional single-gate thin film transistor.

Figure 7:
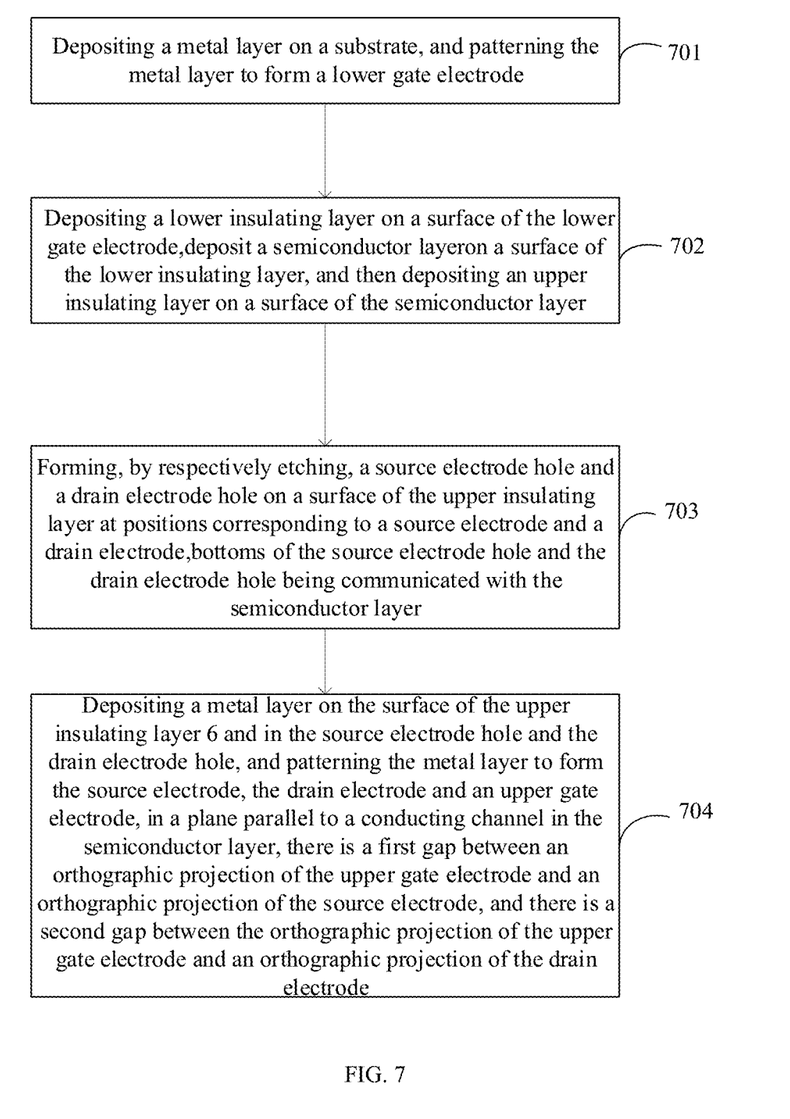
FIG. 7 is a schematic flowchart of a method for preparing a thin film transistor according to an embodiment of the present invention.

FIG. 7 is a schematic flowchart of a method for preparing a thin film transistor according to an embodiment of the present invention. The semiconductor layer 5 in the formed thin film transistor is lapped with the source electrode 2 and the drain electrode 3 in the lapping way as shown in FIG. 2.

As shown in FIG. 7, the method for preparing the thin film transistor comprises the following steps.

Step 701: A metal layer is deposited on a substrate, and the metal layer is patterned to form a lower gate electrode 4. Here, a glass plate can be used as the substrate.

Step 702: A lower insulating layer 7 is deposited on a surface of the lower gate electrode 4 and a semiconductor layer 5 is deposited on a surface of the lower insulating layer 7, and then an upper insulating layer 6 is deposited on a surface of the semiconductor layer 5.

In an embodiment of the present invention, since the lower insulating layer 7 is fitted with the lower gate electrode 4 and the lower gate electrode 4 can also be called a gate electrode, this lower insulating layer 7 can also be called a gate insulating layer.

In an embodiment of the present invention, since the source electrode hole 14 and the drain electrode hole 15 are to be formed by etching in the following steps, the upper insulating layer 6 can also be called an etching stop layer (ESL).

Step 703: A source electrode hole 14 and a drain electrode hole 15 are respectively formed by etching at positions corresponding to the source electrode 2 and the drain electrode 3 on a surface of the upper insulating layer 6, and bottoms of the source electrode hole 14 and the drain electrode hole 15 are communicated with the semiconductor layer 5. In this way, the source electrode 2 and the drain electrode 3 formed in the source electrode hole 14 and the drain electrode hole 15 in the following steps can be lapped with the semiconductor layer 5.

Step 704: A metal layer is deposited on the surface of the upper insulating layer 6 and in the source electrode hole 14 and the drain electrode hole 15, and the metal layer is patterned to form the source electrode 2, the drain electrode 3 and an upper gate electrode 1, and in a plane which is parallel to a conducting channel in the semiconductor layer 5, there is a first gap 8 between an orthographic projection of the upper gate electrode 1 and an orthographic projection of the source electrode 2, and there is a second gap 9 between the orthographic projection of the upper gate electrode 1 and an orthographic projection of the drain electrode 3. It can be seen that, since the upper gate electrode 1, the source electrode 2 and the drain electrode 3 are located in the same layer, the upper gate electrode 1, the source electrode 2 and the drain electrode 3 can be synchronously formed by patterning once without designing a mask etching process for the preparation of the upper gate electrode 1. The preparation cost is therefore saved. On the resulting thin film transistor, a passivation layer or an anode can be deposited or other processes such as OLED preparation can be performed.

For the thin film transistor according to the embodiments of the present invention, in a plane which is parallel to a conducting channel in the semiconductor layer 5, there is the first gap 8 between the orthographic projection of the upper gate electrode 1 and the orthographic projection of the source electrode 2, and there is the second gap 9 between the orthographic projection of the upper gate electrode 1 and the orthographic projection of the drain electrode 3. In this way, the conduction of the upper conducting channel 10 cannot be independently realized by the upper gate electrode 1. Only when the voltage of the lower gate electrode 4 reaches a turn-on voltage, the conduction of the upper conducting channel 10 can be indirectly achieved by the lower conducting channel 11 formed by induction of the lower gate electrode 4. In this way, simultaneous conduction of the upper conducting channel and the lower conducting channel is achieved.

The foregoing descriptions are merely preferred embodiments of the present invention and not intended to limit the present invention. Any modifications, equivalent replacements and improvements made within the spirit and principle of the present invention shall fall into the protection scope of the present invention.

INDUSTRIAL APPLICABILITY

The thin film transistor of the present invention is suitable to be industrially produced by exiting production equipment, and can be applied to liquid crystal display panels with high integration density and high resolution and other related technical products. The structure thereof improves the simultaneous conduction performance of the upper conducting channel and the lower conducting channel in the semiconductor layer.

The method for preparing the thin film transistor of the present invention can make full use of existing production and processing equipment to form a production process. The method is applicable for large-scale industrial production. The resulting thin film transistors have a high mobility.

What is claimed is:

1. A thin film transistor, comprising an upper gate electrode, a lower gate electrode, an upper insulating layer, a lower insulating layer, a semiconductor layer, a source electrode and a drain electrode, wherein the lower insulating layer is arranged on the lower gate electrode, the semiconductor layer is arranged on the lower insulating layer, the semiconductor layer is respectively lapped with the source electrode and the drain electrode, the upper insulating layer covers the semiconductor layer, and the upper gate electrode is arranged on the upper insulating layer, and
wherein, in a plane parallel to a conducting channel in the semiconductor layer, there is a first gap between an orthographic projection of the upper gate electrode and an orthographic projection of the source electrode, and there is a second gap between the orthographic projection of the upper gate electrode and an orthographic projection of the drain electrode;
wherein the source electrode and the drain electrode are arranged on and in contact with the lower insulating layer, and the semiconductor layer has a lower surface lapped with a surface of the source electrode, a surface of the drain electrode and a surface of the lower insulating layer.

2. The thin film transistor according to claim 1, wherein a width of the first gap or a width of the second gap is determined according to an intrinsic resistance of semiconductor material of the semiconductor layer and a minimum leakage current that the semiconductor material can withstand.

3. The thin film transistor according to claim 2, wherein the width of the first gap or the second gap is determined by $D=(2R*W*I_{leak})/U_d$, where $U_d$ is a drain voltage, R is the intrinsic resistance of the semiconductor layer, W is a width of the semiconductor layer, and $I_{leak}$ is a leakage current flowing through the semiconductor layer when a voltage of the lower gate electrode has not reached a turn-on voltage thereof while a voltage of the upper gate electrode has already reached a turn-on voltage thereof.

4. The thin film transistor according to claim 1, wherein, the upper gate electrode and the lower gate electrode in circuit structures are set independently.

5. The thin film transistor according to claim 1, wherein the width of the first gap and/or the width of the second gap are greater than 1 um.

6. The thin film transistor according to claim 1, wherein the width of the first gap and/or the width of the second gap are 3 um.

7. The thin film transistor according to claim 1, wherein a thickness of the semiconductor layer is 30 nm.

* * * * *